United States Patent [19]

Asazawa

[11] Patent Number: 5,596,296
[45] Date of Patent: Jan. 21, 1997

[54] CLOCK DRIVER CIRCUIT

[75] Inventor: Hiroshi Asazawa, Tokyo, Japan

[73] Assignee: NEC Corporation, Japan

[21] Appl. No.: 413,416

[22] Filed: Mar. 30, 1995

[30] Foreign Application Priority Data

Mar. 30, 1994 [JP] Japan ................................. 6-061740

[51] Int. Cl.$^6$ ............................................. G06F 1/04
[52] U.S. Cl. ..................... 327/291; 327/200; 327/201; 327/395; 327/400; 327/407; 327/415
[58] Field of Search ........................ 327/395–6, 400, 327/407, 415, 200–1, 291

[56] References Cited

U.S. PATENT DOCUMENTS 4,154,978  5/1979  Tu ............................................ 327/403
5,434,525  7/1995  Leonowich ............................... 327/396

FOREIGN PATENT DOCUMENTS 2-127814  5/1990  Japan ............................... H03K 5/15

OTHER PUBLICATIONS

Japan Society of Electronics, Information and Communication, Spring Meeting Transactions, 1992, C–565, p. 186.

*Primary Examiner*—Margaret Rose Wambach
*Attorney, Agent, or Firm*—Hayes, Soloway, Hennessey, Grossman & Hage, P.C.

[57] ABSTRACT

A clock driver circuit comprises a first driver including first and second inverters cascaded between an input terminal and a first output terminal for outputting a non-inverted signal delayed from the clock signal applied to the input terminal by a delay amount corresponding to two stages of inverters. The clock driver circuit also comprises and a second driver including third, fourth and fifth inverters cascaded between the input terminal and a second output terminal and a sixth inverter connected between the input terminal and the second output terminal. With this arrangement, a first signal delayed from the clock signal applied to the input terminal by a first delay amount corresponding to the third, fourth and fifth inverters, is synthesized by a wired-OR at the second output terminal with a second signal delayed from the clock signal applied to the input terminal by a second delay amount corresponding to the sixth inverter. Thus, a synthesized inverted signal delayed from the clock signal applied to the input terminal by a delay amount corresponding to two stages of inverters, is outputted from the second output terminal.

6 Claims, 9 Drawing Sheets

CLOCK DRIVER CIRCUIT

BACKGROUND OF THE INVENTION

1. Field of the Invention

The present invention relates to a clock driver circuit for use in a semiconductor device, and more specifically to a clock driver circuit for generating a non-inverted clock signal and an inverted clock signal which have a reduced phase deviation to each other.

2. Description of Related Art

A clock driver circuit for use in a semiconductor device is generally used to distribute a basic clock generated in a clock generator internally provided in the semiconductor device or supplied from an external, to various internal circuits of the semiconductor device.

Referring to FIG. 1, there is shown a circuit diagram of the most general circuit of the clock driver circuit. The shown clock driver circuit includes a pair of inverters 34 and 35 having a high driving power, cascaded between an input terminal 1 and a non-inverted signal output terminal 3. The shown clock driver circuit also includes an inverter 36 connected between the input terminal 1 and an inverted signal output terminal 2.

If a clock signal is supplied through the input terminal 1 to each input of the inverters 34 and 36, a non-inverted clock signal is outputted from an output of the inverter 35 to the non-inverted signal output terminal 3, and an inverted clock signal is outputted from an output of the inverter 36 to the inverted signal output terminal 2.

Japan Society of Electronics, Information and Communication, Spring Meeting Transactions, 1992, C-565, Page 186 discloses another prior art. Referring to FIG. 5 showing a clock driver circuit disclosed in this paper, an even number of inverters 37, 38, 39 and 40 are cascaded between the input terminal 1 and the non-inverted signal output terminal 3, and an even number of inverters 41 and 42 are cascaded between an output of the inverter 37 and the inverted signal output terminal 2. Transistors of the inverters 38 and 39 are designed to have a size larger than that of transistors of the other inverters 37, 40, 41 and 42.

In this example, when a clock signal is applied through the input terminal 1 to an input of the inverter 37, a non-inverted clock signal is outputted from an output of the inverter 40 to the non-inverted signal output terminal 3, and an inverted clock signal is outputted from an output of the inverter 42 to the inverted signal output terminal 2.

Since the non-inverted clock signal is outputted by passing through the four inverter stages 37, 38, 39 and 40, the non-inverted clock signal is delayed in phase from the inverted clock signal outputted by passing through the three inverter stages 37, 41 and 42. However, since the transistor size of the inverters 38 and 39 are designed to be larger than those of the other inverters 37, 40, 41 and 42, the inverters 38 and 39 has a faster switching speed, and therefore, it is possible to obtain the non-inverted clock signal substantially in the same phase as the inverted clock signal.

Japanese Patent Application Laid-open Publication No. JP-A-127814 discloses still another prior art. Referring to FIG. 6 showing a clock driver circuit disclosed in this Japanese patent laid-open publication (partially replaced by a logic gate), a pair of inverters 43 and 44 are cascaded between the input terminal 1 and the non-inverted signal output terminal 3.

On the other hand, an inverted signal generating circuit includes a source follower circuit composed of P-channel insulated gate field effect transistors (called "P-channel MOS transistors" hereinafter) 45 and 46, another source follower circuit composed of N-channel insulated gate field effect transistors (called "N-channel MOS transistors" hereinafter) 47 and 48, and an inverter circuit composed of a P-channel MOS transistor 49 and an N-channel MOS transistor 50. A gate of each of the P-channel MOS transistor 46 and the N-channel MOS transistor 47 is connected to the input terminal 1, and a gate of each of the P-channel MOS transistor 45 and the N-channel MOS transistor 48 is connected to an output of the inverter 43. A source of the P-channel MOS transistor 46 is connected to a gate of the P-channel MOS transistor 49, and a source of the N-channel MOS transistor 47 is connected to a gate of the N-channel MOS transistor 50. Thus, an inverted signal is outputted to the inverted signal output terminal 2 from an output of the inverter circuit composed of the P-channel MOS transistor 49 and the N-channel MOS transistor 50.

Referring to FIG. 2 showing a timing chart illustrating an operation of the conventional clock driver shown in FIG. 1, since two inverter stages are inserted between the input terminal 1 and the non-inverted signal output terminal 3 and on the other hand only one inverter stage is inserted between the input terminal 1 and the inverted signal output terminal 2, the non-inverted output clock signal 3 is delayed from the inverted output clock signal 2 by T6 which corresponds to a delay of one inverter stage. Therefore, when the clock driver circuit is caused to operate at a high speed, it is not possible to obtain a non-inverted clock signal and an inverted clock signal in phase to each other.

Referring to FIG. 3 showing an operation waveform of the conventional clock driver circuit, when a pulse having a frequency of 200 MHz as shown in a lower half of FIG. 3 was applied, a non-inverted clock signal 3 and an inverted clock signal 2 were obtained as shown in an upper half of FIG. 3. It will be noted that, when the input pulse is 200 MHz, the non-inverted clock signal 3 and the inverted clock signal 2 should be properly deviated from each other precisely 2.5 ns, but are actually deviated from each other about 2 ns at a minimum and about 3 ns at maximum.

Here, examine a case that the non-inverted clock signal and the inverted clock signal obtained in the clock driver circuit shown in FIG. 1 are supplied to a master-slave T-type flipflop as a clock.

FIG. 4 shows a circuit diagram of a typical master-slave T-type flipflop. This master-slave T-type flipflop includes a master flipflop comprising a transfer gate 51, inverters 52 and 53 and another transfer gate 53 cascaded as shown with an output of the transfer gate 53 being connected to an input of the inverter 52 so as to form a latch circuit. The transfer gate 51 is controlled to be turned on when a clock C corresponding to the above mentioned non-inverted clock signal is at a low level, and an inverted clock $\overline{C}$ corresponding to the above mentioned inverted clock signal is at a high level. The transfer gate 54 is controlled to be turned on when the clock C is at a high level and the inverted clock $\overline{C}$ is at a low level.

The master-slave T-type flipflop also includes a slave flipflop comprising a transfer gate 55, inverters 56 and 57 and another transfer gate 58 cascaded as shown with an output of the transfer gate 58 being connected to an input of the inverter 56 so as to form a latch circuit. The transfer gate 55 is controlled to be turned on when the clock C is at a high level and the inverted clock $\overline{C}$ is at a low level. The transfer gate 58 is controlled to be turned on when the clock C is at a low level and the inverted clock $\overline{C}$ is at a high level. An output of the inverter 52, which constitutes an output of the master flipflop, is connected to an input of the transfer gate 55 of the slave flipflop, and an output of the inverter 56, which constitutes an output of the slave flipflop, is connected to an output terminal 60 and also connected through an inverter 59 to an input of the transfer gate 51 of the master flipflop.

When the transfer gate 51 is conductive and the transfer gate 54 is non-conductive, the master flipflop is put into a condition capable of receiving an input signal. At this time, the transfer gate 51 is brought into a conductive condition having a small on-resistance, basically when the clock C is at a low level and the inverted clock $\overline{C}$ is at a high level. However, at least if the inverted clock $\overline{C}$ is at a high level or if the clock C is at a low level, the transfer gate 51 can allow passage of the signal with about a double on-resistance. Accordingly, the period T2 in FIG. 2 corresponds to a period of capable of receiving the input signal. Similarly, at least if the inverted clock $\overline{C}$ is at a low level or if the clock C is at high level, the transfer gate 54 becomes a conductive condition and can allow passage of the signal. This period corresponds to the period T1 in FIG. 2.

Accordingly, a period in which the master flipflop is put in a hold condition corresponds to the period T3 in FIG. 2 in which the transfer gate 51 is in the non-conductive condition and the transfer gate 54 is in the conductive condition. During the period T4, the transfer gate 51 is conductive and the transfer gate 54 is non-conductive, so that the master flipflop is in the latching or data receiving condition.

During the period T5 generated by the phase difference between the clock C and the inverted clock $\overline{C}$, both the clock C and the inverted clock $\overline{C}$ are at a high level, and during the period T6 also generated by the phase difference between the clock C and the inverted clock $\overline{C}$, both the clock C and the inverted clock $\overline{C}$ are at a low level. Accordingly, both the master flipflop and the slave flipflop are put into the condition capable of receiving the data signal and allowing passage of the data signal. In this condition, the outputs of the inverters 59 and 53 conflict, and the outputs of the inverters 52 and 57 conflict. This is a cause for malfunction.

In addition, the periods T3 and T4 become shorter than a half of one period of the input clock. In other words, since the non-inverted signal and the inverted signal overlap each other during the periods T5 and T6, the flipflop must operate at a frequency apparently higher than the frequency of the input signal, and therefore, it is happens that the frequency of the input signal must be made low.

On the other hand, in order to overcome the above mentioned defect and to make the non-inverted signal and the inverted signal completely complementary to each other, the conventional clock driver circuit shown in FIG. 5 is configured to have the large size inverters in the path composed of a large number of stages for the non-inverted output signal and the small size inverters in the path composed of a small number of stages for the inverted output signal, for the purpose of cancelling the phase difference between the non-inverted output signal and the inverted output signal.

For example, assuming that next stage inverters connected to the non-inverted signal output terminal 3 and the inverted signal output terminal 2 have a size of "1", the sizes of the inverters 38, 39, 40, 41 and 42 are made "8", "4", "2", "0.37" and "0.61", respectively. If this relation is normalized by putting the size of the smallest inverter 41 to "1", the sizes of the inverters 38, 39, 40, 41 and 42 become "21.6", "10.8", "5.4", "1" and "1.6", respectively. Accordingly, the total of the inverter sizes shown in FIG. 5 becomes "40.4". In other words, the conventional clock driver circuit shown in FIG. 5 is disadvantageous in that the device size becomes large.

Furthermore, the conventional driver circuit shown in FIG. 6 is in common to the conventional driver circuit shown in FIG. 5 in which a pair of complementary output signals can be obtained from the non-inverted signal output terminal 3 and the inverted signal output terminal 2. However, since the conventional driver circuit shown in FIG. 6 includes the source follower circuit composed of the transistors 45 and 46 and the source follower circuit composed of the transistors 47 and 48, when any one of the transistors 45 and 48 acting as an active load is in a conductive condition, if the corresponding transistor 46 or 47 is turned on, a through current flows to pass from a high voltage VDD through the transistors 45 and the transistor 46 to ground GND, or from the high voltage VDD through the transistors 47 and the transistor 48 to the ground GND.

SUMMARY OF THE INVENTION

Accordingly, it is an object of the present invention to provide a clock driver circuit which has overcome the above mentioned defect of the conventional ones.

Another object of the present invention is to provide a clock driver circuit capable of outputting a pair of non-inverted output signal and inverted output signal complementary to each other with no substantial phase deviation, and of suppressing generation of the through current.

The above and other objects of the present invention are achieved in accordance with the present invention by a clock driver circuit comprising an input terminal, an output terminal, a first number of inverters cascaded between the input terminal and the output terminal, and a second number of inverter or inverters connected between the input terminal and the output terminal, the first number being larger than the second number by an even number, and the second number including one.

According to another aspect of the present invention, there is provided a clock driver circuit comprising:

an input terminal for receiving a clock signal;

an inverted signal output terminal for outputting an inverted output clock;

a non-inverted signal output terminal for outputting a non-inverted output clock;

a first driver having an input connected to the input terminal and an output for outputting an inverted output signal to the inverted signal output terminal;

a second driver having an input connected to the input terminal and an output for outputting a non-inverted output signal to the non-inverted signal output terminal;

a selected one of the first driver and the second driver including a first number of inverters cascaded between the input terminal and the output terminal of the selected driver so as to output at the output terminal of the selected driver a first signal delayed from the clock signal applied to the input terminal by a first delay amount corresponding to the first number of inverters, and a second number of inverter or inverters cascaded between the input terminal and the output terminal of the selected driver so as to output at the output terminal of the selected driver a second signal delayed from the clock signal applied to the input terminal by a second delay amount corresponding to the second number of inverter or inverters, so that the first and second signals are combined at the output terminal of the selected driver so as to generate a synthesized signal delayed from the clock signal applied to the input terminal by an intermediate value of the first and second delay amounts, the first number being larger than the second number by an even number and the second number including one, the other of the first driver and the second driver having a delay time substantially equal to the intermediate value of the first and second delay amounts, whereby the non-inverted output signal and the inverted output signal are generated by the first driver and the second driver, respectively, and have the same phase and are complementary to each other.

According to still another aspect of the present invention, there is provided a clock driver circuit comprising:

a first input terminal for receiving a non-inverted clock signal;

a second input terminal for receiving an inverted clock signal;

a first output terminal;

a second output terminal;

a first driver having an input connected to the first input terminal and an output connected to the first output terminal, the first driver including at least first and second inverters cascaded;

a second driver having an input connected to the second input terminal and an output connected to the second output terminal, the second driver including at least third and fourth inverters cascaded;

a first phase compensating means including at least fifth inverter having an input connected to the second input terminal and an output connected to an output of the second inverter so that a signal delayed from the non-inverted clock signal applied to the first input terminal by a delay amount corresponding to the first and second inverters is synthesized by a wired-OR with a signal delayed from the inverted clock signal applied to the second input terminal by a delay amount corresponding to the fifth inverter; and a second phase compensating means including at least sixth inverter having an input connected to the first input terminal and an output connected to an output of the fourth inverter so that a signal delayed from the inverted clock signal applied to the second input terminal by a delay amount corresponding to the third and fourth inverters is synthesized by a wired-OR with a signal delayed from the non-inverted clock signal applied to the first input terminal by a delay amount corresponding to the sixth inverter, whereby a pair of complementary signals are outputted from the first output terminal and the second output terminal.

According to a further aspect of the present invention, there is provided a clock driver circuit comprising:

an input terminal for receiving a clock signal;

a first intermediate node;

a second intermediate node;

a first driver including at least first and second inverters cascaded between the input terminal and the first intermediate node;

a second driver including at least third, fourth and fifth inverters cascaded between the input terminal and the second intermediate node and a sixth inverter connected between the input terminal and the second intermediate node so that a first signal delayed from the clock signal applied to the input terminal by a first delay amount corresponding to the third, fourth and fifth inverters, is synthesized by a wired-OR at the second intermediate node with a second signal delayed from the clock signal applied to the input terminal by a second delay amount corresponding to the sixth inverter, so as to generate a synthesized signal delayed from the clock signal applied to the input terminal by an intermediate value of the first and second delay amounts;

a first output terminal;

a second output terminal;

a third driver having an input connected to the first intermediate node and an output connected to the first output terminal, the first driver including at least seventh and eighth inverters cascaded;

a fourth driver having an input connected to the second intermediate node and an output connected to the second output terminal, the second driver including at least ninth and tenth inverters cascaded;

a first phase compensating means including at least a eleventh inverter having an input connected to the second intermediate node and an output connected to an output of the eighth inverter so that a signal delayed from a signal on the first intermediate node by a delay amount corresponding to the seventh and eighth inverters is synthesized by a wired-OR with a signal delayed from a signal on the second intermediate node by a delay amount corresponding to the eleventh inverter; and a second phase compensating means including at least a twelfth inverter having an input connected to the first intermediate node and an output connected to an output of the tenth inverter so that a signal delayed from the signal on the second intermediate node by a delay amount corresponding to the ninth and tenth inverters is synthesized by a wired-OR with a signal delayed from the signal on the first intermediate node by a delay amount corresponding to the twelfth inverter, whereby a pair of complementary signals are outputted from the first output terminal and the second output terminal.

The above and other objects, features and advantages of the present invention will be apparent from the following description of preferred embodiments of the invention with reference to the accompanying drawings.

DESCRIPTION OF THE PREFERRED EMBODIMENTS

Figure 1:
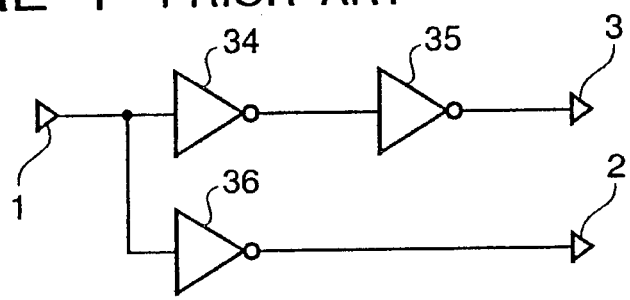
FIG. 1 is a circuit diagram of the most general circuit of the conventional clock driver circuit.
Figure 2:
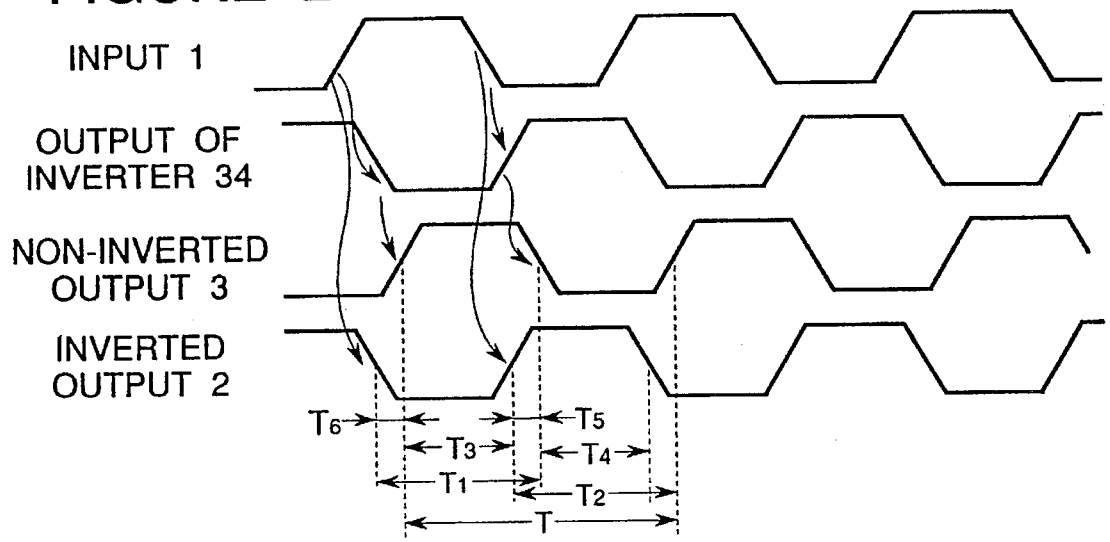
FIG. 2 is a timing chart illustrating an operation of the conventional clock driver shown in FIG. 1.
Figure 3:
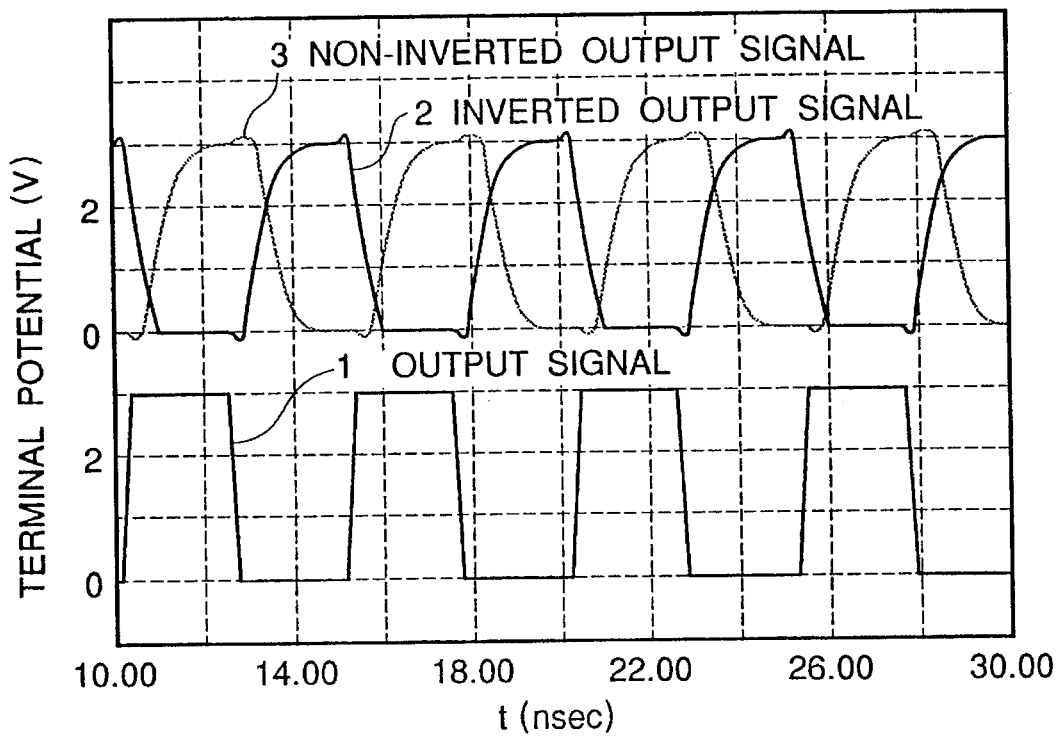
FIG. 3 is a waveform diagram showing an operating waveform of the conventional clock driver shown in FIG. 1.
Figure 4:
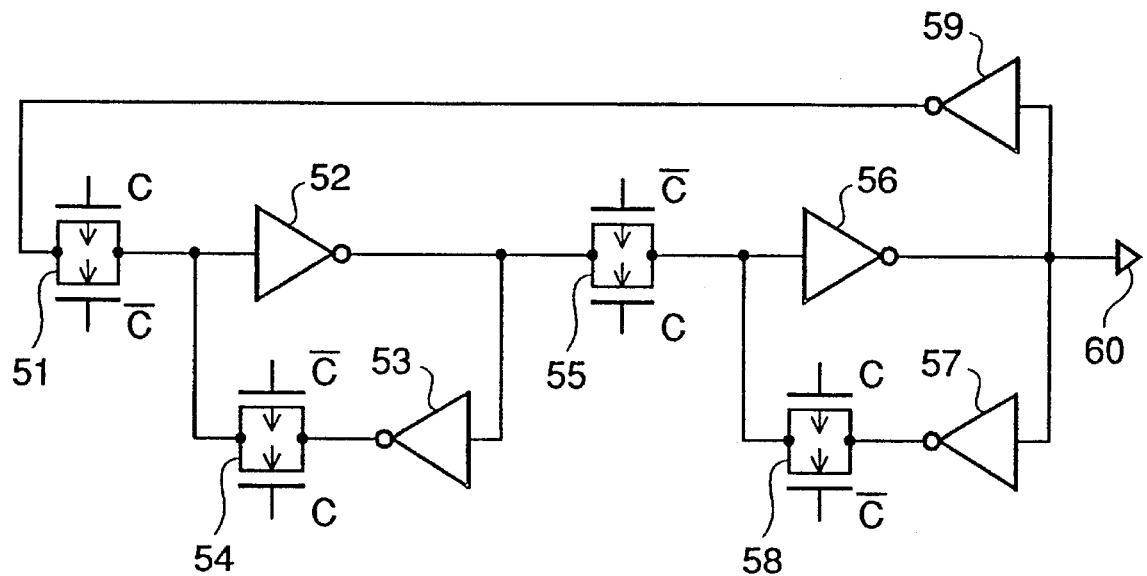
FIG. 4 is a circuit diagram of a typical master-slave T-type flipflop.
Figure 5:
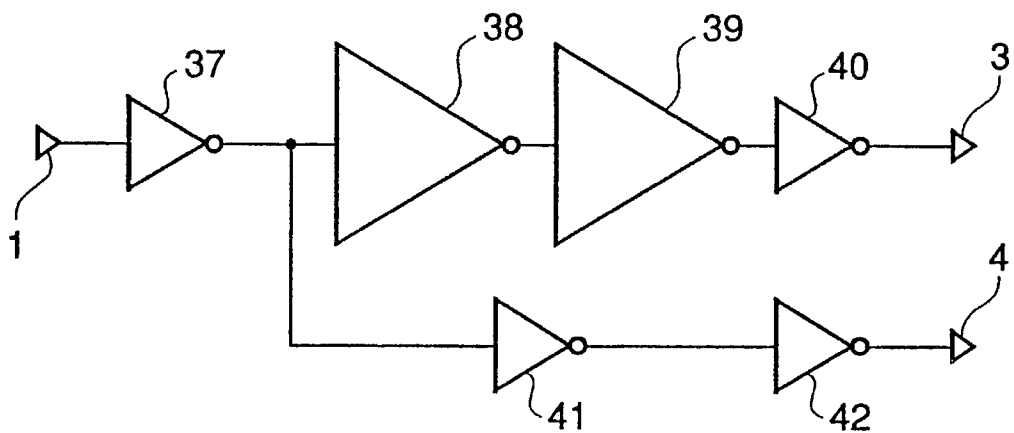
FIG. 5 is a circuit diagram of another conventional clock driver circuit.
Figure 6:
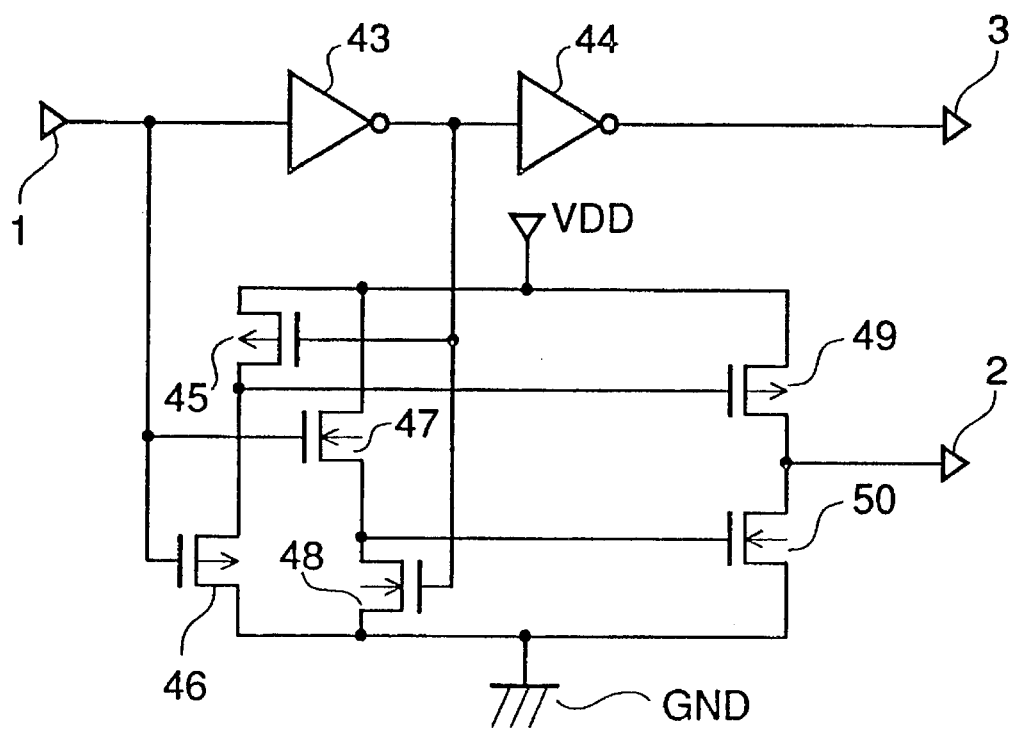
FIG. 6 is a circuit diagram of still another conventional clock driver circuit.
Figure 7:
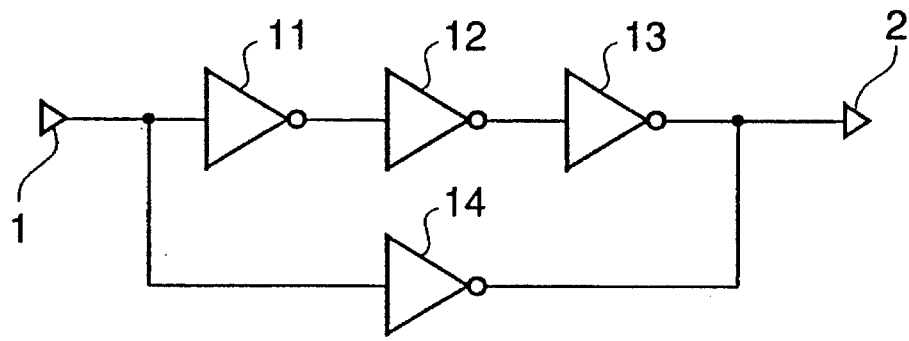
FIG. 7 is a circuit diagram of a first embodiment of the clock driver circuit in accordance with the present invention.

Referring to FIG. 7, there is shown a circuit diagram of the first embodiment of the clock driver circuit in accordance with the present invention.

The clock driver circuit shown in FIG. 7 includes three inverters 11, 12 and 13 cascaded between an input terminal 1 and an inverted signal output terminal 2, and another inverter 14 having an input connected to the input terminal 1 and an output connected to the inverted signal output terminal 2, so that the inverter 14 is in parallel to the three cascaded inverters 11, 12 and 13.

With this arrangement, an inverted signal having a delay amount corresponding to three stages of the cascaded inverters 11, 12 and 13 is combined or synthesized by a wired-OR at the output terminal 2 with another inverted signal having a delay amount corresponding to only one stage of the inverter 14, with the result that an inverted signal having a delay amount corresponding to two inverter stages can be obtained from the inverted signal output terminal 2.

Figure 8:
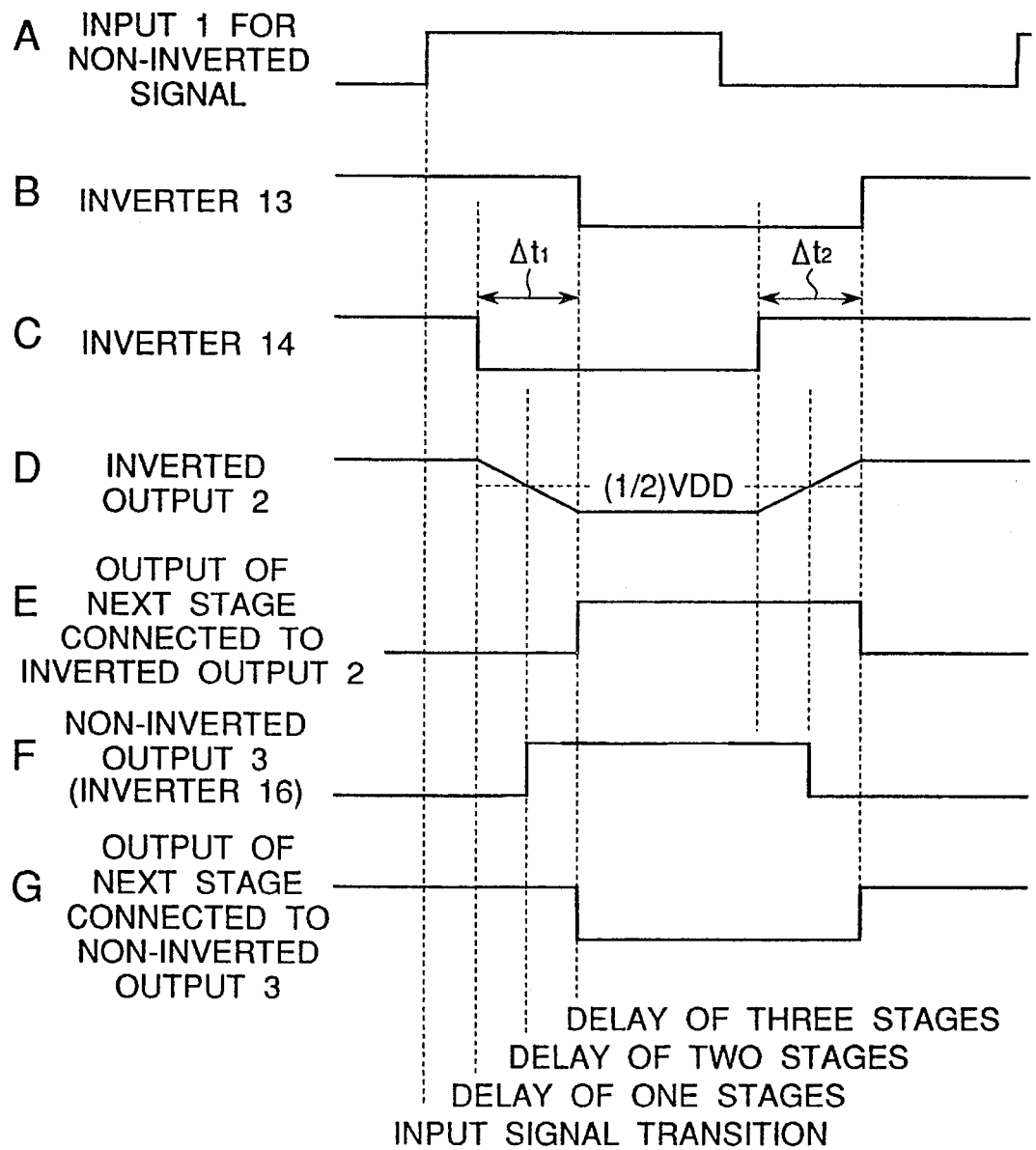
FIG. 8 is a timing chart illustrating an operation of the first and second embodiments of the clock driver circuit.

Referring to a timing chart of FIG. 8 illustrating an operation of this embodiment, an inverted signal (delayed from the non-inverted signal applied to the input terminal 1 by a delay amount corresponding to three stages of the cascaded inverters 11, 12 and 13) and another inverted signal (delayed from the non-inverted signal applied to the input terminal 1 by a delay amount corresponding to one stage of the inverter 14) are supplied to the wired-OR, so that a signal waveform as shown at "INVERTED OUTPUT 2" in FIG. 8 can be obtained.

In FIG. 8, "INVERTER 13" shows a waveform appearing on the output of the inverter 13 when the output of the inverter 13 is not connected to the output terminal 2, namely in the condition that the output of the inverter 13 is not coupled through the wired-OR with the output of the inverter 14, and "INVERTER 14" shows a waveform appearing on the output of the inverter 14 when the output of the inverter 14 is not connected to the output terminal 2, namely in the condition that the output of the inverter 14 is not coupled through the wired-OR with the output of the inverter 13.

A period $\Delta t1$ in FIG. 8 corresponds to a period in which the output of the inverter 14 (having the delay time shorter than the total delay time of the three cascaded inverters 11, 12 and 13) is brought to a low level but the output of the inverter 13 is still maintained at a high level. Therefore, during the period $\Delta t1$, the output of the inverter 13 and the output of the inverter 14 compete against each other, so that the voltage on the inverted signal output terminal 2 lowers from the high level through an intermediate potential (VDD/2) and reaches to and becomes stable at the low level when the output of the inverter 13 is brought into the low level.

Similarly, a period $\Delta t2$ in FIG. 8 corresponds to a period in which the output of the inverter 14 is brought to a high level but the output of the inverter 13 (having the delay time of the three cascaded inverters 11, 12 and 13 longer than the delay time of the inverter 14) is still maintained at a low level. Therefore, during the period $\Delta t2$, the output of the inverter 13 and the output of the inverter 14 compete against each other, so that the voltage on the inverted signal output terminal 2 elevates from the low level through the intermediate potential and reaches to and becomes stable at the high level when the output of the inverter 13 is brought into the high level.

Incidentally, since the timing chart of the above mentioned operation has many parts common to an operation of a second embodiment described hereinafter, the timing chart of FIG. 8 illustrates not only the first embodiment but also the second embodiment.

In the above mentioned embodiment, the three inverters 11, 12 and 13 have been cascaded, but inverters of larger than three stages can be cascaded dependently upon a required or desired delay amount. However, it is preferred to limit the number of the cascaded inverters to five, in view of a tradeoff between the number of required transistors and the desired delay amount. If the inverters 11, 12 and 13 are replaced with four cascaded inverters and the inverter 14 is replaced with two cascaded inverters, a non-inverted output signal can be obtained from the output terminal 2.

Figure 9:
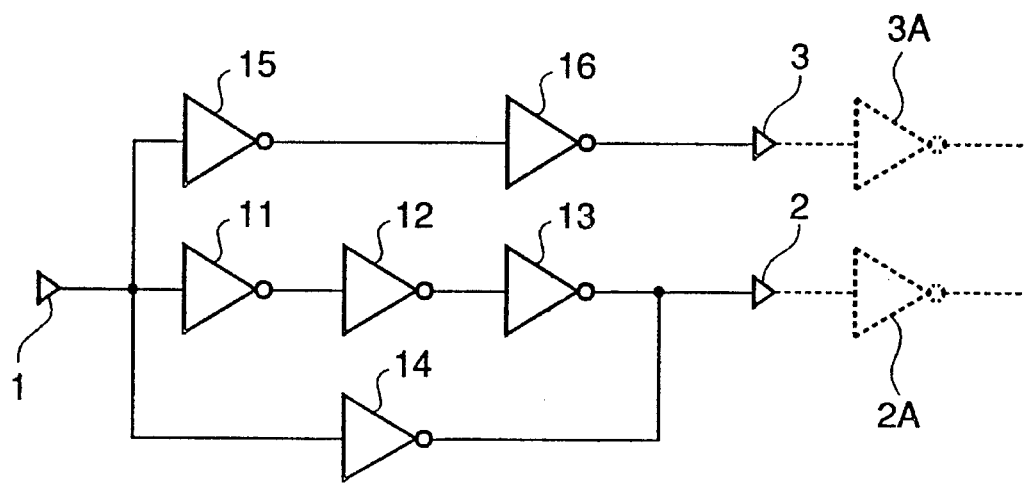
FIG. 9 is a circuit diagram of a second embodiment of the clock driver circuit in accordance with the present invention.

Now, referring to FIG. 9, there is shown a circuit diagram of a second embodiment of the clock driver circuit in accordance with the present invention. In FIG. 9, elements corresponding to those shown in FIG. 7 are given the same Reference Numerals, and explanation thereof will be omitted.

As seen from comparison between FIGS. 7 and 9, the second embodiment is different from the first embodiment in that a pair of inverters 15 and 16 are cascaded between the input terminal 1 and a non-inverted signal output terminal 3 so that a non-inverted output signal and the inverted output signal can be obtained from the non-inverted signal output terminal 3 and the inverted signal output terminal 2, respectively.

With this arrangement, since the non-inverted output signal is delayed from the clock signal applied to the input terminal 1 by a delay amount corresponding to two stages of the cascaded inverters 15 and 16, the non-inverted signal has the same delay amount as that of the inverted output signal obtained from the inverted signal output terminal 2, and therefore, a pair of complementary clock signals having the same delay amount can be obtained.

Referring to FIG. 8, again, the period in which the level on the inverted signal output terminal 2 transits from the high level to the low level starts from the moment a delay time of one inverter stage has elapsed from the rising-up of the input clock signal and terminates at the moment a delay time of three cascaded inverter stages has elapsed from the rising-up of the input clock signal. This transition period corresponds to a delay time of two cascaded inverter stages. If a next stage inverter gate circuit 2A connected to the output terminal 2 is driven by an intermediate level (VDD/2) during this transition period, the gate circuit 2A outputs an output signal as shown at "OUTPUT OF NEXT STAGE CONNECTED TO INVERTED SIGNAL OUTPUT 2" in FIG. 8. On the other hand, if a next stage inverter gate circuit 3A connected to the output terminal 3 is driven by an intermediate level of the non-inverted output signal delayed from the rising-up of the input clock signal by the delay amount of the two cascaded inverters 15 and 16, the gate circuit 3A outputs an output signal as shown at "OUTPUT OF NEXT STAGE CONNECTED TO NON-INVERTED SIGNAL OUTPUT 3" in FIG. 8. Thus, a pair of complementary clock signals can be obtained.

Figure 10:
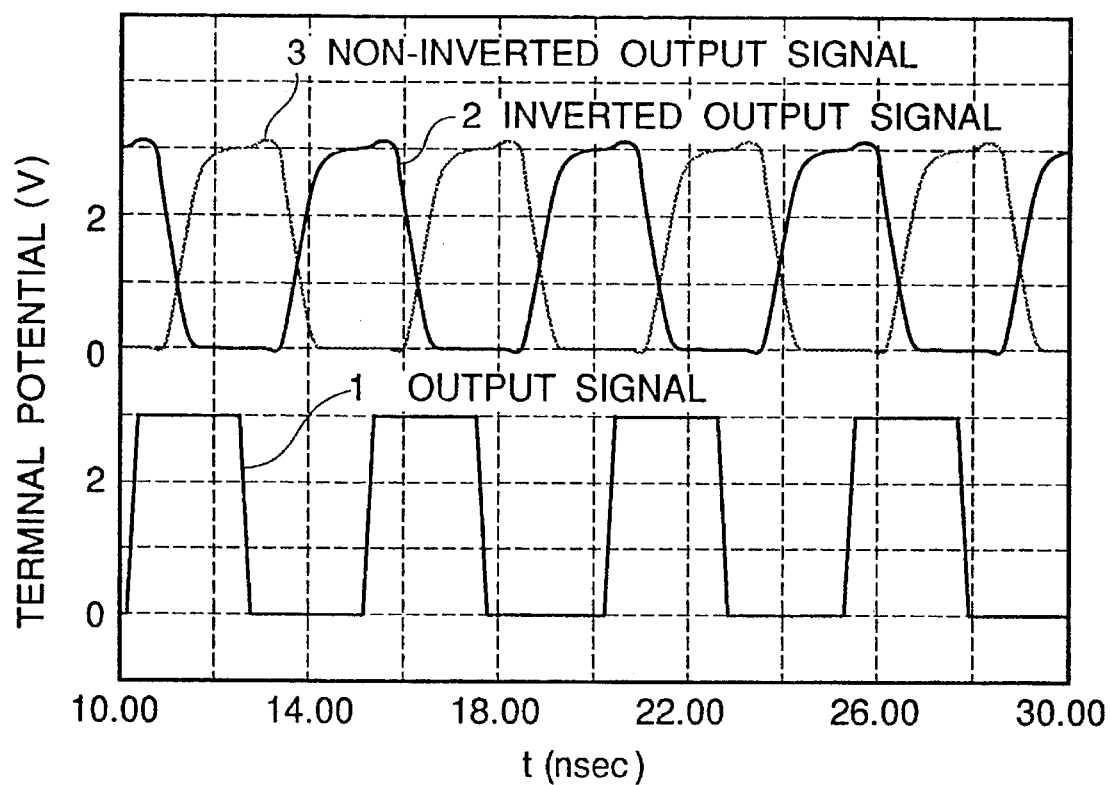
FIG. 10 is a waveform diagram showing an operating waveform of the second embodiment of the clock driver circuit.

Referring to FIG. 10 showing an operating waveform of this embodiment of the clock driver circuit, if a pulse having a frequency of 200 MHz as shown in a lower half of FIG. 10 is supplied to the input terminal 1, and a non-inverted clock signal 3 and an inverted clock signal 2 as shown in an upper half of FIG. 10 are outputted from the signal output terminals.

Similarly to the first embodiment, in this second embodiment, the three inverters 11, 12 and 13 have been cascaded, but inverters of larger than three stages can be cascaded dependently upon a required or desired delay amount. However, it is preferred to limit the number of the cascaded inverters to five, in view of a tradeoff between the number of required transistors and the desired delay amount. In this case, if the inverters 11, 12 and 13 are replaced with five cascaded inverters, the inverter 14 is replaced with three cascaded inverters, and the inverters 15 and 16 are replaced with four cascaded inverters. If the inverters 11, 12 and 13 are replaced with four cascaded inverters and the inverter 14 is replaced with two cascaded inverters, a non-inverted output signal can be obtained from the output terminal 2, and if the inverters 15 and 16 are replaced with three cascaded inverters, an inverted output signal can be obtained from the output terminal 3.

Figure 11:
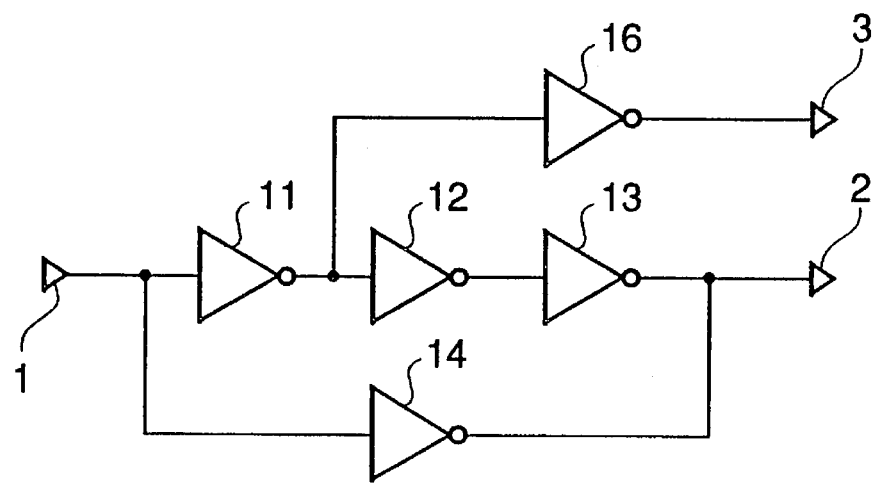
FIG. 11 is a circuit diagram of a third embodiment of the clock driver circuit in accordance with the present invention.

Referring to FIG. 11, there is shown a circuit diagram of a third embodiment of the clock driver circuit in accordance with the present invention. In FIG. 11, elements corresponding to those shown in FIG. 7 are given the same Reference Numerals, and explanation thereof will be omitted.

As seen from comparison between FIGS. 7 and 11, the third embodiment is different from the first embodiment in that an inverter 16 is connected between an output of the inverter 11 and a non-inverted signal output terminal 3 so that a non-inverted output signal can be obtained from the non-inverted signal output terminal 3.

With this arrangement, similarly to the second embodiment, since the non-inverted output signal is delayed from the clock signal applied to the input terminal 1 by a delay amount corresponding to two stages of the cascaded inverters 11 and 16, the non-inverted signal has the same delay amount as that of the inverted output signal obtained from the inverted signal output terminal 2, and therefore, a pair of complementary clock signals having the same delay amount can be obtained.

Also in this third embodiment, the three inverters 11, 12 and 13 have been cascaded, but inverters of larger than three stages can be cascaded dependently upon a required or desired delay amount. However, it is preferred to limit the number of the cascaded inverters to five, in view of a tradeoff between the number of required transistors and the desired delay amount. In this case, if the inverters 12 and 13 are replaced with four cascaded inverters, the inverter 14 is replaced with three cascaded inverters, and the inverter 16 is replaced with three cascaded inverters. If the inverters 12 and 13 are replaced with three cascaded inverters and the inverter 14 is replaced with two cascaded inverters, a non-inverted output signal can be obtained from the output terminal 2, and if the inverter 16 is replaced with two cascaded inverters, an inverted output signal can be obtained from the output terminal 3.

Figure 12:
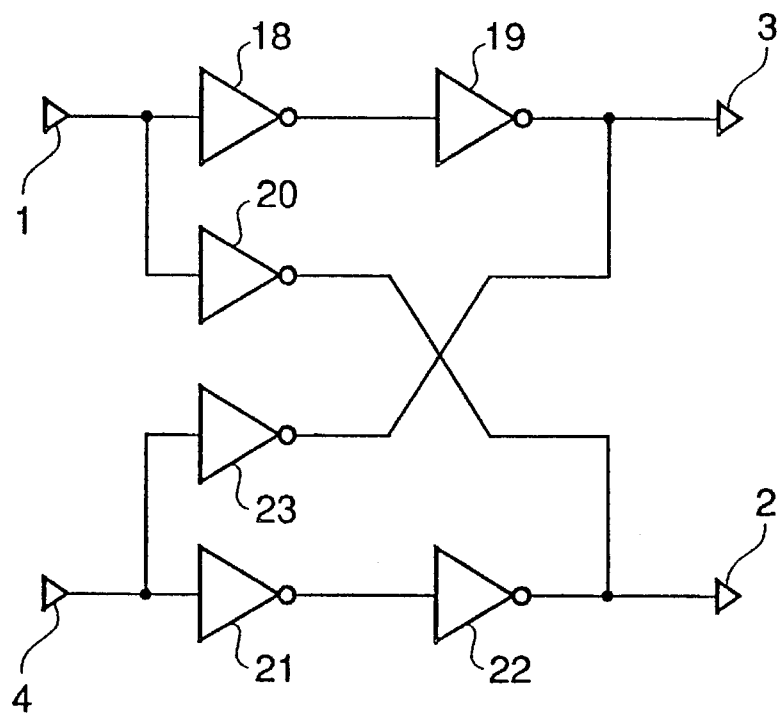
FIG. 12 is a circuit diagram of a fourth embodiment of the clock driver circuit in accordance with the present invention.

Referring to FIG. 12, there is shown a circuit diagram of the fourth embodiment of the clock driver circuit in accordance with the present invention.

The clock driver circuit of the fourth embodiment includes two inverters 18 and 19 cascaded between a non-inverted signal input terminal 1 and a non-inverted signal output terminal 3, and two inverters 21 and 22 cascaded between an inverted signal input terminal 4 and an inverted signal output terminal 2. The clock driver circuit of the fourth embodiment also includes an inverter 20 having an input connected to the non-inverted signal input terminal 1 and an output connected to the inverted signal output terminal 2 and an inverter 23 having an input connected to the inverted signal input terminal 4 and an output connected to the non-inverted signal output terminal 3.

With this arrangement, a signal obtained from the non-inverted signal applied from the input terminal 1 and passing through two stages of the cascaded inverters 18 and 19 is combined by a wired-OR at the output terminal 3 with another signal obtained from the inverted signal applied from the input terminal 4 and passing through the inverter 23, so that a non-inverted output signal can be obtained from the inverted signal output terminal 3. On the other hand, a signal obtained from the inverted signal applied from the input terminal 4 and passing through two stages of the cascaded inverters 21 and 22 is combined by another wired-OR at the output terminal 2 with another signal obtained from the non-inverted signal applied from the input terminal 1 and passing through the inverter 20, so that an inverted output signal can be obtained from the inverted signal output terminal 2.

Figure 13:
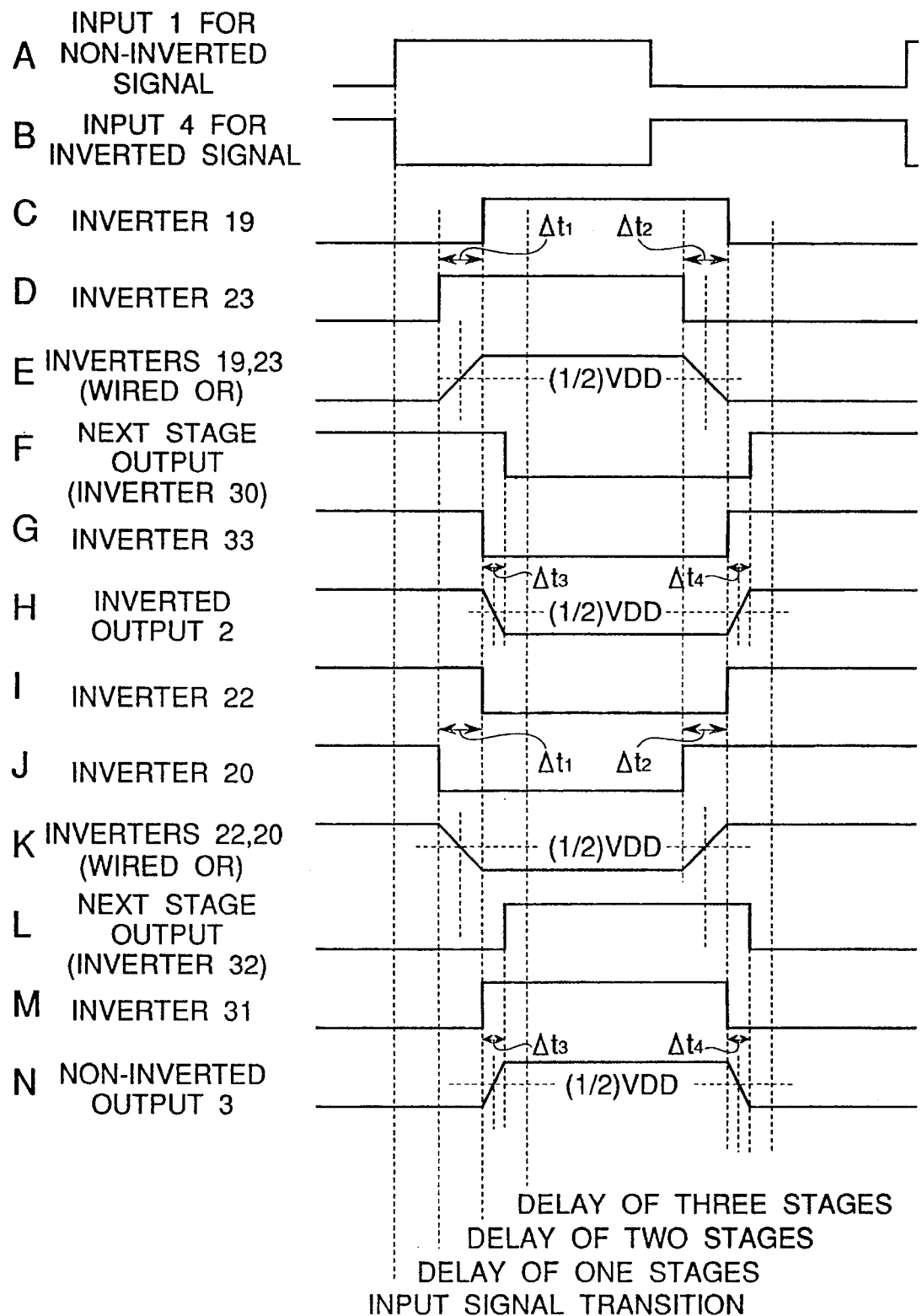
FIG. 13 is a timing chart illustrating an operation of the fourth and sixth embodiments of the clock driver circuit.

Here, reference is made to waveforms "A" to "E" and "I" "K" in a timing chart of FIG. 13 illustrating an operation of this embodiment. In FIG. 13, "INVERTER 19 " shows a waveform appearing on the output of the inverter 19 when the output of the inverter 19 is not connected to the output terminal 3, namely in the condition that the output of the inverter 19 is not coupled through the wired-OR with the output of the inverter 23, and "INVERTER 23" shows a waveform appearing on the output of the inverter 23 when the output of the inverter 23 is not connected to the inverted signal output terminal 3, namely in the condition that the output of the inverter 23 is not coupled through the wired-OR with the output of the inverter 19. In addition, "INVERTER 22" shows a waveform appearing on the output of the inverter 22 in the condition that the output of the inverter 22 is not coupled through the wired-OR with the output of the inverter 20, and "INVERTER 20" shows a waveform appearing on the output of the inverter 20 in the condition that the output of the inverter 20 is not coupled through the wired-OR with the output of the inverter 22.

In the non-inverted output signal terminal 3, after the moment the output of the inverter 23 transits from the low level to the high level (which is earlier than the low-to-high transition of the inverter 19), the output of the inverter 19 is still maintained at a low level during a period Δt1 in FIG. 13. Therefore, during the period Δt1, the output of the inverter 19 and the output of the inverter 20 compete against each other, so that the voltage on the non-inverted signal output terminal 3 rises from the low level through an intermediate potential (VDD/2) and reaches to and becomes stable at the high level when the output of the inverter 19 is brought into the high level. Similarly, during a period Δt2 in FIG. 13, the output of the inverter 23 has already transited from the high level to the low level, but the output of the inverter 19 is still maintained at the low level. Therefore, during the period Δt2, the output of the inverter 23 and the output of the inverter 19 compete against each other, so that the voltage on the non-inverted signal output terminal 3 lowers from the high level through the intermediate potential and reaches to and becomes stable at the low level when the output of the inverter 19 is brought into low level.

On the other hand, in the inverted output signal terminal 2, during a period Δt1 in FIG. 13, the output of the inverter 20 has already transited from the high level to the low level, but the output of the inverter 22 is still maintained at the high level. Therefore, during the period Δt1, the output of the inverter 20 and the output of the inverter 22 compete against each other, so that the voltage on the inverted signal output terminal 2 lowers from the high level through the intermediate potential and reaches to and becomes stable at the low level when the output of the inverter 22 is brought into a low level. Similarly, during a period Δt2 in FIG. 13, the output of the inverter 20 has already transited from the low level to the high level, but the output of the inverter 22 is still maintained at the low level. Therefore, during the period Δt2, the output of the inverter 20 and the output of the inverter 22 compete against each other, so that the voltage on the inverted signal output terminal 2 rises from the low level through an intermediate potential (VDD/2) and reaches to and becomes stable at the high level when the output of the inverter 22 is brought into the high level. Thus, the non-inverted output signal and the inverted output signal have the same delay amount and therefore are complementary to each other.

The above mentioned explanation is made under the condition that a pair of completely complementary input signals as shown in "A" and "B" of FIG. 13 are applied. If the inverted input signal shown in "B" of FIG. 13 is phase-deviated from the non-inverted input signal shown in "A" of FIG. 13 by +Δtd or −Δtd, the phase of the output of the inverters 23 and 22 is shifted from the phases shown in "D" and "I" of FIG. 13 by +Δtd or −Δtd. Accordingly, if the phase deviation is +Δtd, the signals on the output terminals 3 and 2 become in phase at positions which are phase-shifted from the positions shown in "E" ("INVERTERS 19, 23 (WIRED OR)") and "K" ("INVERTERS 22, 20 (WIRED OR)") of FIG. 13 by +Δtd/2, respectively. If the phase deviation is −Δtd, the signals on the output terminals 3 and 2 become in phase at positions which are phase-shifted from the positions shown in "E" ("INVERTERS 19, 23 (WIRED OR)") and "K" ("INVERTERS 22, 20 (WIRED OR)") of FIG. 13 by −Δtd/2, respectively.

Accordingly, even if the input signals applied to the input terminals 1 and 4 are not completely complementary to each other and therefore have a phase deviation from each other, a pair of completely complementary signals having the same phase can be obtained from the non-inverted signal output terminal 3 and the inverted signal output terminal 2.

Incidentally, since the timing chart of the above mentioned operation has many parts common to an operation of a sixth embodiment described hereinafter, the timing chart of FIG. 13 illustrates not only the fourth embodiment but also the sixth embodiment.

In the above mentioned embodiment, the two inverters 18 and 19 at the non-inverted signal side and the two inverters 21 and 22 at the inverted signal side have been cascaded, respectively, but inverters of larger than two stages can be cascaded dependently upon a required or desired delay amount. However, it is preferred to limit the number of the cascaded inverters to five, in view of a tradeoff between the number of required transistors and the desired delay amount. If the inverters 18 and 19 and 21 and 22 are replaced with five cascaded inverters, respectively, and the inverters 20 and 23 are replaced with four cascaded inverters, respectively, it is sufficient if the non-inverted input signal and the inverted input signal are supplied to the input terminals 4 and 1, respectively.

Figure 14:
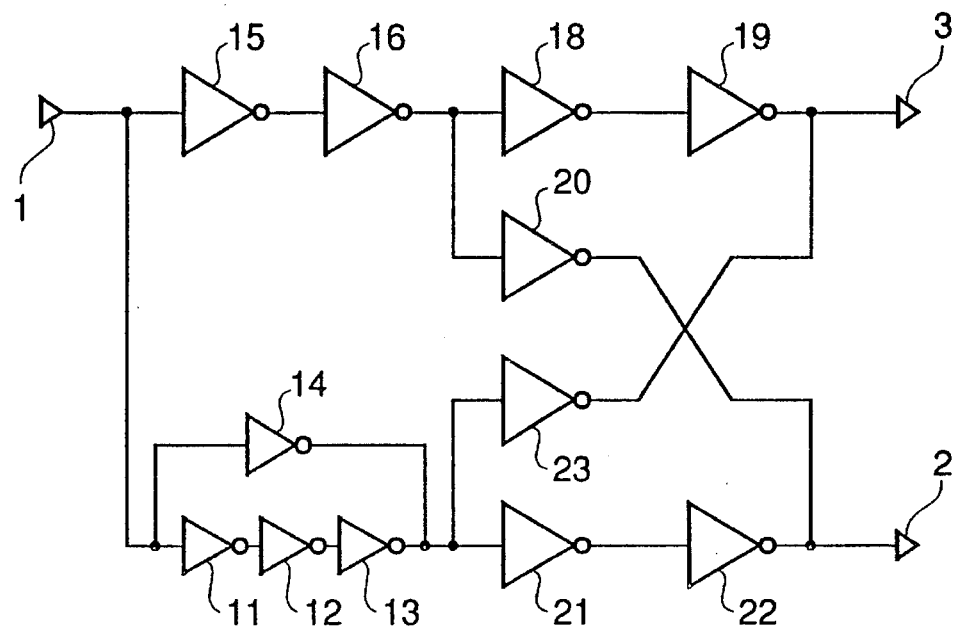
FIG. 14 is a circuit diagram of a fifth embodiment of the clock driver circuit in accordance with the present invention.

Referring to FIG. 14, there is shown a circuit diagram of a fifth embodiment of the clock driver circuit in accordance with the present invention. In FIG. 14, elements corresponding to those shown in FIGS. 7 to 13 are given the same Reference Numerals, and explanation thereof will be omitted.

As seen from comparison between FIGS. 9, 12 and 14, the fifth embodiment is different from the fourth embodiment in that the fifth embodiment is a combination of the second and fourth embodiments. Namely, the clock driver circuit shown in FIG. 9 is cascaded with the clock driver circuit shown in FIG. 12. In other words, the non-inverted signal output terminal (the output of the inverter 16) and the inverted signal output terminal (the output of the inverter 13) of the second embodiment are connected to the non-inverted signal input terminal (an input of the inverter 18) and the inverted signal input (an input of the inverter 21) of the fourth embodiment, respectively.

With this arrangement, the complementary signals can be obtained form the non-inverted output terminal 3 and the inverted output terminal 2 since the non-inverted output signal and the inverted output signal synthesized by the clock driver circuit of the second embodiment are further processed and synthesized by the clock driver circuit of the fourth embodiment.

Figure 15:
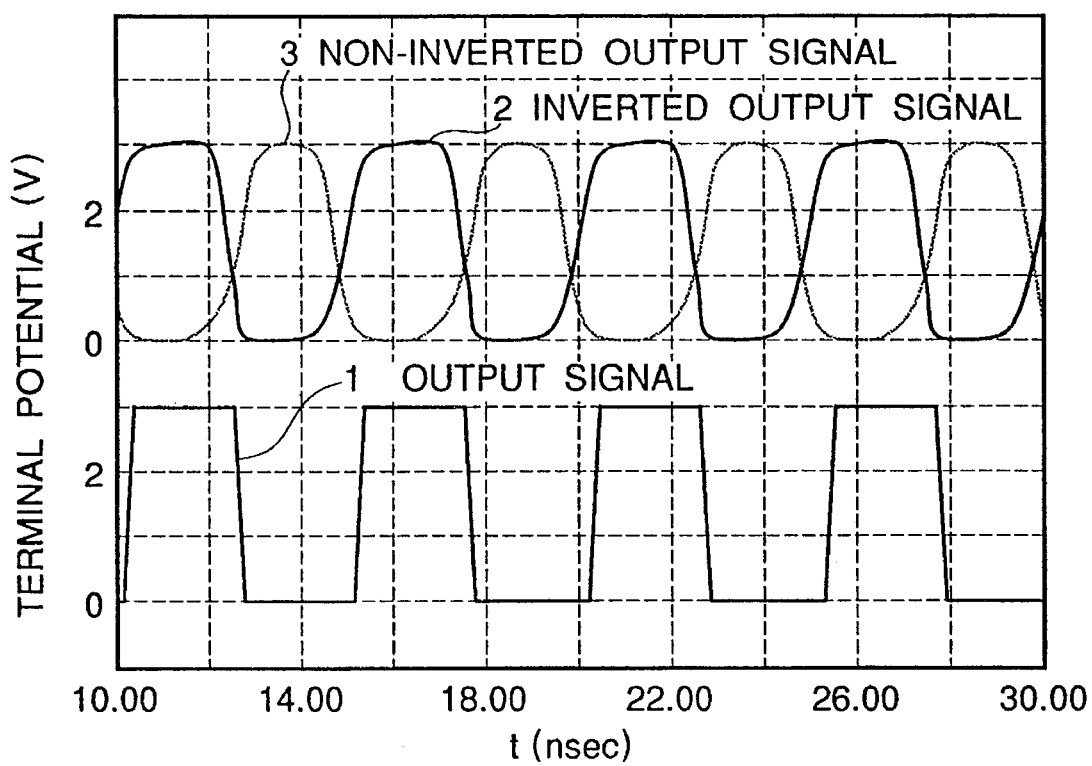
FIG. 15 is a waveform diagram showing an operating waveform of the fifth embodiment of the clock driver circuit.

Referring to FIG. 15 showing an operating waveform of the fifth embodiment of the clock driver circuit, if a pulse having a frequency of 200 MHz as shown in a lower half of FIG. 15 is supplied to the input terminal 1 shown in FIG. 14, a non-inverted clock signal 3 and an inverted clock signal 2 complementary to each other as shown in an upper half of FIG. 15 are outputted from the signal output terminals. Since the phase matching is further added, a pair of complementary signals having a precision higher than that of the second embodiment can be obtained.

The number of the inverter stages in this fifth embodiment can be modified dependently upon the required delay amount, similarly to the second, third and fifth embodiments.

Figure 16:
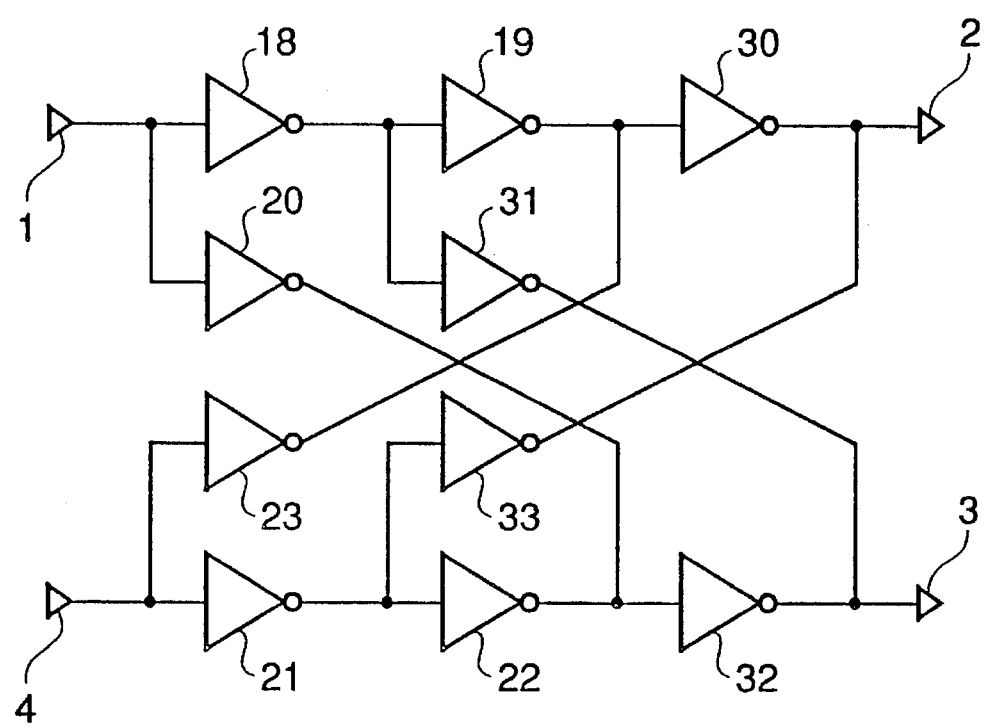
FIG. 16 is a circuit diagram of a sixth embodiment of the clock driver circuit in accordance with the present invention.

Referring to FIG. 16 showing a sixth embodiment of the clock driver circuit in accordance with the present invention. This sixth embodiment is a modification of the fourth embodiment. The sixth embodiment is such that inverters 30 and 32 are added to the clock driver circuit of the fourth embodiment and inverters 31 and 33 for synthesizing the non-inverted signal and the inverted signal are further added.

Specifically, the inverter 30 is cascaded between the output of the inverter 19 and the inverted signal output terminal 2, and the output of the inverter 21 is connected through the inverter 33 to the output terminal 2. The inverter 32 is cascaded between the output of the inverter 22 and the non-inverted signal output terminal 3, and the output of the inverter 18 is connected through the inverter 31 to the output terminal 3.

With this arrangement, similarly to the operation of the clock driver circuit of the fourth embodiment, the phase compensation between the non-inverted signal and the inverted signal, realized by synthesizing the output signal having a delay of one inverter stage and the output signal having a delay of two inverter stages, is performed two time. As a result, a pair of clock signals complementary to each other at a further high precision can be obtained form the non-inverted signal output terminal 3 and the inverted signal output terminal 2.

Referring to FIG. 13 again, in the non-inverted output signal terminal, after the moment the output of the inverter 33 transits from the high level to the low level (which is earlier than the high-to-low transition of the inverter 30), the output of the inverter 30 is still maintained at a high level during a period $\Delta t3$ in FIG. 13. Therefore, during the period $\Delta t3$, the output of the inverter 33 and the output of the inverter 30 compete against each other, so that the voltage on the output terminal 2 lowers from the high level through an intermediate potential (VDD/2) and reaches to and becomes stable at the low level when the output of the inverter 30 is brought into the low level. Similarly, during a period $\Delta t4$ in FIG. 13, the output of the inverter 33 has already transited from the low level to the high level, but the output of the inverter 30 is still maintained at the low level. Therefore, during the period $\Delta t4$, the output of the inverter 33 and the output of the inverter 30 compete against each other, so that the voltage on the output terminal 2 elevates from the low level through the intermediate potential and reaches to and becomes stable at the high level when the output of the inverter 19 is brought into the high level.

On the other hand, in the inverted output signal terminal, during a period $\Delta t3$ in FIG. 13, the output of the inverter 31 has already transited from the low level to the high level, but the output of the inverter 32 is still maintained at the low level. Therefore, during the period $\Delta t3$, the output of the inverter 31 and the output of the inverter 32 compete against each other, so that the voltage on the output terminal 3 elevates from the low level through the intermediate potential and reaches to and becomes stable at the high level when the output of the inverter 32 is brought into a high level. Similarly, during a period $\Delta t4$ in FIG. 13, the output of the inverter 31 has already transited from the high level to the low level, but the output of the inverter 32 is still maintained at the high level. Therefore, during the period $\Delta t4$, the output of the inverter 30 and the output of the inverter 32 compete against each other, so that the voltage on the output terminal 3 lowers from the high level through an intermediate potential (VDD/2) and reaches to and becomes stable at the low level when the output of the inverter 32 is brought into the low level. Thus, the non-inverted output signal and the inverted output signal have the same delay amount and therefore are complementary to each other.

Similarly the fourth embodiment, also in the sixth embodiment, even if the input signals applied to the input terminals 1 and 4 are not completely complementary to each other and therefore have a phase deviation from each other, a pair of completely complementary signals having the same phase can be obtained from the output terminals 2 and 3.

In the sixth embodiment, the three inverters 18,19 and 30 and the three inverters 21, 22 and 32 have been cascaded, respectively, but inverters of larger than three stages can be cascaded dependently upon a required or desired delay amount. However, it is preferred to limit the number of the cascaded inverters to five, in view of a tradeoff between the number of required transistors and the desired delay amount. If four inverter stages are cascaded, it is sufficient if the non-inverted input signal and the inverted input signal are supplied to the input terminals 4 and 1, respectively.

As seen from the above, the clock driver circuit in accordance with the present invention can generate the non-inverted clock signal and the inverted clock signal complementary to each other at a high precision.

The inverters constituting the clock driver circuit in accordance with the present invention can be formed of only transistors having the same size, and therefore, it is unnecessary to individually design the transistor size ratio. Therefore, since the device size can be made small, it is possible to suppress the increase of the chip size.

Furthermore, since it is unnecessary to include the source follower as a constituent, there is no through current flowing through the source follower, and an extra electric power consumption can be avoided.

The invention has thus been shown and described with reference to the specific embodiments. However, it should be noted that the present invention is in no way limited to the details of the illustrated structures but changes and modifications may be made within the scope of the appended claims.

We claim:

1. A clock driver circuit comprising:

an input terminal for receiving a clock signal;

an inverted signal output terminal for outputting an inverted output clock;

a non-inverted signal output terminal for outputting a non-inverted output clock;

a first driver having an input connected to said input terminal and an output for outputting an inverted output signal to said inverted signal output terminal;

a second driver having an input connected to said input terminal and an output for outputting a non-inverted output signal to said non-inverted signal output terminal;

a selected one of said first driver and said second driver including a first number of inverters cascaded between said input terminal and said output terminal of said selected driver so as to output at said output terminal of said selected driver a first signal delayed from said clock signal applied to said input terminal by a first delay amount corresponding to said first number of inverters, and a second number of inverter or inverters cascaded between said input terminal and said output terminal of said selected driver so as to output at said output terminal of said selected driver a second signal delayed from said clock signal applied to said input terminal by a second delay amount corresponding to said second number of inverter or inverters, so that said first and second signals are combined at said output terminal of said selected driver so as to generate a synthesized signal delayed from said clock signal applied to said input terminal by an intermediate value of said first and second delay amounts, said first number being larger than said second number by an even number and said second number including one, the other of said first driver and said second driver having a delay time substantially equal to said intermediate value of said first and second delay amounts, whereby said non-inverted output signal and said inverted output signal are generated by said first driver and said second driver, respectively, and have the same phase and are complementary to each other.

2. A clock driver circuit claimed in claim 1 wherein said selected driver is said first driver, which includes three inverters cascaded between said input terminal and said inverted signal output terminal so as to output at said inverted signal output terminal a first signal delayed from said clock signal applied to said input terminal by a first delay amount corresponding to said three cascaded inverters, and one inverter connected between said input terminal and said inverted signal output terminal so as to output at said inverted signal output terminal a second signal delayed from said clock signal applied to said input terminal by a second delay amount corresponding to said one inverter, so that said first and second signals are combined at said inverted signal output terminal so as to generate a synthesized signal delayed from said clock signal applied to said input terminal by a delay amount corresponding to two cascaded inverters, and wherein the other of said first driver and said second driver is said second driver, which includes two inverters cascaded between said input terminal and said non-inverted signal output terminal so that said non-inverted output signal outputted from said non-inverted signal output terminal has a delay amount corresponding to two cascaded inverters.

3. A clock driver circuit claimed in claim 1 wherein said second driver includes an inverter, and said first driver includes three cascaded inverters, said inverter of said second driver having an input connected to an output of a first inverter of the three cascaded inverters of said first driver and an output connected to said non-inverted signal output terminal.

4. A clock driver circuit comprising:

a first input terminal for receiving a non-inverted clock signal;

a second input terminal for receiving an inverted clock signal;

a first output terminal;

a second output terminal;

a first driver having an input connected to said first input terminal and an output connected to said first output terminal, said first driver including at least first and second inverters cascaded;

a second driver having an input connected to said second input terminal and an output connected to said second output terminal, said second driver including at least third and fourth inverters cascaded;

a first phase compensating means including at least fifth inverter having an input connected to said second input terminal and an output connected to an output of said second inverter so that a signal delayed from said non-inverted clock signal applied to said first input terminal by a delay amount corresponding to said first and second inverters is synthesized by a wired-OR with a signal delayed from said inverted clock signal applied to said second input terminal by a delay amount corresponding to said fifth inverter; and a second phase compensating means including at least sixth inverter having an input connected to said first input terminal and an output connected to an output of said fourth inverter so that a signal delayed from said inverted clock signal applied to said second input terminal by a delay amount corresponding to said third and fourth inverters is synthesized by a wired-OR with a signal delayed from said non-inverted clock signal applied to said first input terminal by a delay amount corresponding to said sixth inverter, whereby a pair of complementary signals are outputted from said first output terminal and said second output terminal.

5. A clock driver circuit claimed in claim 4 wherein said first driver includes a seventh inverter having an input connected to an output of said second inverter and an output connected to said first output terminal;

wherein said second driver includes an eighth inverter having an input connected to an output of said fourth inverter and an output connected to said second output terminal;

wherein said first phase compensating means includes a ninth inverter having an input connected to an output of said third inverter and an output connected to an output of said seventh inverter; and wherein said second phase compensating means includes a tenth inverter having an input connected to an output of said first inverter and an output connected to an output of said eighth inverter.

6. A clock driver circuit comprising:

an input terminal for receiving a clock signal;

a first intermediate node;

a second intermediate node;

a first driver including at least first and second inverters cascaded between said input terminal and said first intermediate node;

a second driver including at least third, fourth and fifth inverters cascaded between said input terminal and said second intermediate node and a sixth inverter connected between said input terminal and said second intermediate node so that a first signal delayed from said clock signal applied to said input terminal by a first delay amount corresponding to said third, fourth and fifth inverters, is synthesized by a wired-OR at said second intermediate node with a second signal delayed from said clock signal applied to said input terminal by a second delay amount corresponding to said sixth inverter, so as to generate a synthesized signal delayed from said clock signal applied to said input terminal by an intermediate value of said first and second delay amounts;

a first output terminal;

a second output terminal;

a third driver having an input connected to said first intermediate node and an output connected to said first output terminal, said first driver including at least seventh and eighth inverters cascaded;

a fourth driver having an input connected to said second intermediate node and an output connected to said second output terminal, said second driver including at least ninth and tenth inverters cascaded;

a first phase compensating means including at least a eleventh inverter having an input connected to said second intermediate node and an output connected to an output of said eighth inverter so that a signal delayed from a signal on said first intermediate node by a delay amount corresponding to said seventh and eighth inverters is synthesized by a wired-OR with a signal delayed from a signal on said second intermediate node by a delay amount corresponding to said eleventh inverter; and a second phase compensating means including at least a twelfth inverter having an input connected to said first intermediate node and an output connected to an output of said tenth inverter so that a signal delayed from the signal on said second intermediate node by a delay amount corresponding to said ninth and tenth inverters is synthesized by a wired-OR with a signal delayed from the signal on said first intermediate node by a delay amount corresponding to said twelfth inverter, whereby a pair of complementary signals are outputted from said first output terminal and said second output terminal.

* * * * *